(12) United States Patent
Nagyvary et al.

(10) Patent No.: US 9,012,771 B1
(45) Date of Patent: Apr. 21, 2015

(54) SOLAR CELL RECEIVER SUBASSEMBLY WITH A HEAT SHIELD FOR USE IN A CONCENTRATING SOLAR SYSTEM

(75) Inventors: John Nagyvary, Albuquerque, NM (US); James Foresi, Albuquerque, NM (US)

(73) Assignee: Suncore Photovoltaics, Inc., Albuquerque, NM (US)

( * ) Notice: Subject to any disclaimer, the term of this patent is extended or adjusted under 35 U.S.C. 154(b) by 414 days.

(21) Appl. No.: 12/764,657

(22) Filed: Apr. 21, 2010

Related U.S. Application Data

(63) Continuation-in-part of application No. 12/553,813, filed on Sep. 3, 2009.

(51) Int. Cl.
*H01L 31/024* (2014.01)
*H01L 31/052* (2014.01)
*H01L 31/054* (2014.01)

(52) U.S. Cl.
CPC ................................... *H01L 31/054* (2013.01)

(58) Field of Classification Search
USPC .............................. 136/246, 259; 33/246, 259
See application file for complete search history.

(56) References Cited

U.S. PATENT DOCUMENTS

| | | | |
|---|---|---|---|
| 3,589,946 A | | 6/1971 | Krishnan et al. |
| 3,798,040 A | * | 3/1974 | Kamin et al. ................. 501/128 |
| 3,811,954 A | | 5/1974 | Lindmayer |
| 3,966,499 A | | 6/1976 | Yasui et al. |
| 3,999,283 A | | 12/1976 | Dean et al. |
| 4,001,864 A | | 1/1977 | Gibbons |
| 4,017,332 A | | 4/1977 | James |
| 4,109,640 A | | 8/1978 | Smith |

(Continued)

FOREIGN PATENT DOCUMENTS

| | | |
|---|---|---|
| DE | 26 07 005 C2 | 9/1976 |
| DE | 26 07 509 A1 | 9/1977 |

(Continued)

OTHER PUBLICATIONS

Abdel Mesih et al., "Loss of optical quality of a photovoltaic thermal concentrator device at different tracking position," 4th International Conference on Solar Concentrators for the Generation of Electricity or Hydrogen, Mar. 12-16, 2007, San Lorenzo de El Escorial, Spain; 4 pgs.

(Continued)

*Primary Examiner* — Jennifer Michener
*Assistant Examiner* — Magali P Slawski
(74) *Attorney, Agent, or Firm* — Mueting, Raasch & Gebhardt P.A.

(57) ABSTRACT

Solar cell receiver subassemblies for use in a concentrating solar system that concentrates the solar energy onto a solar cell for converting solar energy to electricity. The subassemblies may include an optical element defining an optical channel and forming an optical path. The subassemblies may also include a solar cell receiver comprising a support and a solar cell mounted on the support adjacent to the optical element and in the optical path of the optical channel. The solar cell may include one or more III-V compound semiconductor layers and may be capable of generating in excess of 20 watts of peak DC power. The subassemblies may also include a heat shield mounted over and peripherally adjacent to exterior sides of the optical element to cover and block concentrated light from reaching a surface of the support adjacent to the solar cell.

13 Claims, 4 Drawing Sheets

(56) References Cited

U.S. PATENT DOCUMENTS

| | | | |
|---|---|---|---|
| 4,164,432 | A | 8/1979 | Boling |
| 4,168,696 | A | 9/1979 | Kelly |
| 4,186,033 | A | 1/1980 | Boling |
| 4,188,238 | A | 2/1980 | Boling |
| 4,191,593 | A | 3/1980 | Cacheux |
| 4,192,583 | A | 3/1980 | Horton |
| 4,231,808 | A | 11/1980 | Tabei et al. |
| 4,268,709 | A | 5/1981 | Boling |
| 4,292,959 | A | 10/1981 | Coburn, Jr. |
| 4,329,535 | A | 5/1982 | Rapp |
| 4,338,480 | A | 7/1982 | Antypas et al. |
| 4,438,168 | A * | 3/1984 | Testard ............ 428/193 |
| 4,460,232 | A | 7/1984 | Sotolongo |
| 4,521,801 | A | 6/1985 | Kato et al. |
| 4,574,659 | A | 3/1986 | Arndt |
| 4,585,318 | A | 4/1986 | Seifert |
| 4,711,972 | A | 12/1987 | O'Neill |
| 4,759,803 | A | 7/1988 | Cohen |
| 4,830,678 | A | 5/1989 | Todorof et al. |
| 4,834,805 | A | 5/1989 | Erbert |
| 4,939,205 | A | 7/1990 | Derudder et al. |
| 5,009,720 | A | 4/1991 | Hokuyo et al. |
| 5,019,177 | A | 5/1991 | Wanlass |
| 5,053,083 | A | 10/1991 | Sinton |
| 5,091,018 | A | 2/1992 | Fraas et al. |
| 5,096,505 | A | 3/1992 | Fraas et al. |
| 5,118,361 | A | 6/1992 | Fraas et al. |
| 5,153,780 | A | 10/1992 | Jorgensen et al. |
| 5,167,724 | A | 12/1992 | Chiang |
| 5,217,539 | A | 6/1993 | Fraas et al. |
| 5,255,666 | A | 10/1993 | Curchod |
| 5,322,572 | A | 6/1994 | Wanlass |
| 5,342,453 | A | 8/1994 | Olson |
| 5,374,317 | A | 12/1994 | Lamb et al. |
| 5,376,185 | A | 12/1994 | Wanlass |
| 5,405,453 | A | 4/1995 | Ho et al. |
| 5,409,550 | A | 4/1995 | Safir |
| 5,460,659 | A | 10/1995 | Krut |
| 5,498,297 | A | 3/1996 | O'Neill et al. |
| 5,616,185 | A | 4/1997 | Kukulka |
| 5,622,078 | A | 4/1997 | Mattson |
| 5,660,644 | A | 8/1997 | Clemens |
| 5,742,009 | A * | 4/1998 | Hamzehdoost et al. ...... 174/260 |
| 5,936,777 | A | 8/1999 | Dempewolf |
| 5,944,913 | A | 8/1999 | Hou et al. |
| 5,951,785 | A | 9/1999 | Uchihashi et al. |
| 5,959,787 | A | 9/1999 | Fairbanks |
| 5,977,478 | A | 11/1999 | Hibino et al. |
| 5,990,414 | A | 11/1999 | Posnansky |
| 6,020,555 | A | 2/2000 | Garboushian et al. |
| 6,031,179 | A | 2/2000 | O'Neill |
| 6,043,425 | A | 3/2000 | Assad |
| 6,057,505 | A | 5/2000 | Ortabasi |
| 6,077,722 | A | 6/2000 | Jansen et al. |
| 6,080,927 | A | 6/2000 | Johnson |
| 6,091,020 | A | 7/2000 | Fairbanks et al. |
| 6,103,970 | A | 8/2000 | Kilmer et al. |
| 6,239,354 | B1 | 5/2001 | Wanlass |
| 6,252,155 | B1 | 6/2001 | Ortabasi |
| 6,252,287 | B1 | 6/2001 | Kurtz et al. |
| 6,278,054 | B1 | 8/2001 | Ho et al. |
| 6,281,426 | B1 | 8/2001 | Olson et al. |
| 6,300,557 | B1 | 10/2001 | Wanlass |
| 6,300,558 | B1 | 10/2001 | Takamoto et al. |
| 6,316,716 | B1 | 11/2001 | Hilgrath |
| 6,326,540 | B1 | 12/2001 | Kilmer et al. |
| 6,331,670 | B2 | 12/2001 | Takehara et al. |
| 6,340,788 | B1 | 1/2002 | King et al. |
| 6,344,612 | B1 | 2/2002 | Kuwahara et al. |
| 6,359,210 | B2 | 3/2002 | Ho et al. |
| 6,372,980 | B1 | 4/2002 | Freundlich |
| 6,384,317 | B1 | 5/2002 | Kerschaver et al. |
| 6,399,874 | B1 | 6/2002 | Olah |
| 6,452,086 | B1 | 9/2002 | Muller |
| 6,469,241 | B1 | 10/2002 | Penn |
| 6,482,672 | B1 | 11/2002 | Hoffman et al. |
| 6,483,093 | B1 | 11/2002 | Takemura et al. |
| 6,600,100 | B2 | 7/2003 | Ho et al. |
| 6,603,069 | B1 | 8/2003 | Muhs et al. |
| 6,610,919 | B2 | 8/2003 | Ohkubo |
| 6,617,508 | B2 | 9/2003 | Kilmer et al. |
| 6,660,928 | B1 | 12/2003 | Patton et al. |
| 6,680,432 | B2 | 1/2004 | Sharps et al. |
| 6,700,054 | B2 | 3/2004 | Cherney et al. |
| 6,700,055 | B2 | 3/2004 | Barone |
| 6,730,840 | B2 | 5/2004 | Sasaoka et al. |
| 6,799,742 | B2 | 10/2004 | Nakamura et al. |
| 6,804,062 | B2 | 10/2004 | Atwater et al. |
| 6,903,261 | B2 | 6/2005 | Habraken et al. |
| 6,951,819 | B2 | 10/2005 | Iles et al. |
| 6,959,993 | B2 | 11/2005 | Gross et al. |
| 7,071,407 | B2 | 7/2006 | Fatemi et al. |
| 7,119,271 | B2 | 10/2006 | King et al. |
| 7,192,146 | B2 | 3/2007 | Gross et al. |
| 7,238,879 | B2 | 7/2007 | Matsushita et al. |
| 7,244,998 | B2 | 7/2007 | Nakata |
| 7,381,886 | B1 | 6/2008 | Aiken |
| 7,671,270 | B2 | 3/2010 | Fang |
| 7,807,920 | B2 | 10/2010 | Linke et al. |
| 7,980,314 | B2 | 7/2011 | Mack |
| 8,093,492 | B2 | 1/2012 | Hering et al. |
| 8,148,628 | B2 | 4/2012 | Fang |
| 2001/0006066 | A1 | 7/2001 | Cherney et al. |
| 2002/0040727 | A1 | 4/2002 | Stan et al. |
| 2002/0066828 | A1 | 6/2002 | Nakamura et al. |
| 2002/0075579 | A1 | 6/2002 | Vasylyev et al. |
| 2002/0117675 | A1 | 8/2002 | Mascarenhas |
| 2002/0139415 | A1 | 10/2002 | Shimizu et al. |
| 2002/0148497 | A1 | 10/2002 | Sasaoka et al. |
| 2002/0164834 | A1 | 11/2002 | Boutros et al. |
| 2003/0015233 | A1 | 1/2003 | Barone |
| 2003/0070707 | A1 | 4/2003 | Kings et al. |
| 2003/0121542 | A1 | 7/2003 | Harneit et al. |
| 2003/0136442 | A1 | 7/2003 | Takamoto |
| 2003/0140962 | A1 | 7/2003 | Sharps et al. |
| 2003/0145884 | A1 | 8/2003 | King et al. |
| 2003/0178057 | A1 | 9/2003 | Fujii |
| 2004/0031517 | A1 | 2/2004 | Bareis |
| 2004/0045598 | A1 | 3/2004 | Narayanan et al. |
| 2004/0084077 | A1 | 5/2004 | Aylaian et al. |
| 2004/0112424 | A1 | 6/2004 | Araki et al. |
| 2004/0134531 | A1 | 7/2004 | Habraken et al. |
| 2004/0149331 | A1 | 8/2004 | Sharps et al. |
| 2004/0173257 | A1 | 9/2004 | Rogers |
| 2004/0194820 | A1 | 10/2004 | Barone |
| 2004/0261838 | A1 | 12/2004 | Cotal et al. |
| 2004/0261839 | A1 | 12/2004 | Gee et al. |
| 2005/0034751 | A1 | 2/2005 | Gross et al. |
| 2005/0034752 | A1 | 2/2005 | Gross et al. |
| 2005/0046977 | A1 | 3/2005 | Shifman |
| 2005/0048310 | A1 | 3/2005 | Cocchi et al. |
| 2005/0051205 | A1 | 3/2005 | Mook, Jr. |
| 2005/0081908 | A1 | 4/2005 | Stewart |
| 2005/0081909 | A1 | 4/2005 | Paull |
| 2005/0092360 | A1 | 5/2005 | Clark |
| 2005/0109386 | A1 | 5/2005 | Marshall |
| 2005/0145274 | A1 | 7/2005 | Polce et al. |
| 2005/0206834 | A1 | 9/2005 | D'Agostino |
| 2005/0268958 | A1 | 12/2005 | Aoyama |
| 2005/0274411 | A1 | 12/2005 | King et al. |
| 2006/0042650 | A1 | 3/2006 | Ochs |
| 2006/0054211 | A1 | 3/2006 | Meyers |
| 2006/0119305 | A1 | 6/2006 | Lee et al. |
| 2006/0130892 | A1 | 6/2006 | Algora |
| 2006/0144435 | A1 | 7/2006 | Wanlass |
| 2006/0162768 | A1 | 7/2006 | Wanlass |
| 2006/0169315 | A1 | 8/2006 | Levin |
| 2006/0185713 | A1 | 8/2006 | Mook, Jr. |
| 2006/0185726 | A1 | 8/2006 | Rogers et al. |
| 2006/0231130 | A1 | 10/2006 | Sharps et al. |
| 2006/0249198 | A1 | 11/2006 | Rhee |
| 2006/0283497 | A1 | 12/2006 | Hines |
| 2007/0034250 | A1 | 2/2007 | Dutta |
| 2007/0044833 | A1 | 3/2007 | Chern et al. |

(56) References Cited

U.S. PATENT DOCUMENTS

| | | | |
|---|---|---|---|
| 2007/0089777 A1 | 4/2007 | Johnson et al. | |
| 2007/0095385 A1 | 5/2007 | Shin et al. | |
| 2007/0116414 A1 | 5/2007 | Penumatcha et al. | |
| 2007/0188876 A1 | 8/2007 | Hines et al. | |
| 2007/0193620 A1 | 8/2007 | Hines et al. | |
| 2007/0199563 A1 | 8/2007 | Fox | |
| 2007/0227581 A1 | 10/2007 | Chen et al. | |
| 2007/0246040 A1 | 10/2007 | Schaafsma | |
| 2007/0277873 A1 | 12/2007 | Cornfeld et al. | |
| 2008/0029151 A1 | 2/2008 | McGlynn et al. | |
| 2008/0123313 A1 | 5/2008 | Horne et al. | |
| 2008/0128586 A1 | 6/2008 | Johnson et al. | |
| 2008/0258051 A1 | 10/2008 | Heredia et al. | |
| 2008/0308154 A1 | 12/2008 | Cart et al. | |
| 2009/0000662 A1 | 1/2009 | Harwood et al. | |
| 2009/0025778 A1* | 1/2009 | Rubin et al. | 136/246 |
| 2009/0026279 A1 | 1/2009 | Dittmer et al. | |
| 2009/0032086 A1* | 2/2009 | Kats et al. | 136/246 |
| 2009/0032092 A1* | 2/2009 | Fang | 136/255 |
| 2009/0032093 A1 | 2/2009 | Fang | |
| 2009/0056790 A1 | 3/2009 | Tian et al. | |
| 2009/0101207 A1 | 4/2009 | Milbourne et al. | |
| 2009/0107540 A1 | 4/2009 | Milbourne | |
| 2009/0107541 A1* | 4/2009 | Linke et al. | 136/246 |
| 2009/0114213 A1 | 5/2009 | McDonald et al. | |
| 2009/0114265 A1* | 5/2009 | Milbourne et al. | 136/246 |
| 2009/0114280 A1 | 5/2009 | Jensen et al. | |
| 2009/0117332 A1 | 5/2009 | Ellsworth et al. | |
| 2009/0120499 A1 | 5/2009 | Prather et al. | |
| 2009/0120500 A1 | 5/2009 | Prather et al. | |
| 2009/0140406 A1 | 6/2009 | Horne et al. | |
| 2009/0159122 A1 | 6/2009 | Shook et al. | |
| 2009/0159126 A1 | 6/2009 | Chan et al. | |
| 2009/0159128 A1* | 6/2009 | Shook et al. | 136/259 |
| 2009/0173376 A1 | 7/2009 | Spencer et al. | |
| 2009/0199890 A1 | 8/2009 | Hering et al. | |
| 2009/0199891 A1 | 8/2009 | Hering et al. | |
| 2010/0018570 A1 | 1/2010 | Cashion et al. | |
| 2010/0032004 A1 | 2/2010 | Baker et al. | |
| 2010/0037935 A1 | 2/2010 | Vaid et al. | |
| 2010/0083998 A1 | 4/2010 | Seel et al. | |
| 2010/0139752 A1 | 6/2010 | Fang | |
| 2010/0218806 A1 | 9/2010 | Arab et al. | |
| 2010/0229947 A1 | 9/2010 | Seel | |
| 2010/0302654 A1* | 12/2010 | Amano et al. | 359/742 |
| 2010/0307563 A1* | 12/2010 | Vilella | 136/246 |
| 2010/0313954 A1 | 12/2010 | Seel et al. | |
| 2011/0048535 A1 | 3/2011 | Nagyvary et al. | |
| 2011/0155217 A1 | 6/2011 | Yang et al. | |

FOREIGN PATENT DOCUMENTS

| | | |
|---|---|---|
| DE | 29 24 510 A1 | 1/1981 |
| DE | 196 09 283 A1 | 9/1997 |
| DE | 102004050638 | 2/2006 |
| DE | 10 2005 000 767 A1 | 7/2006 |
| DE | 10 2005 047 132 A1 | 4/2007 |
| DE | 10 2008 012 335 A1 | 3/2009 |
| EP | 1469528 | 10/2004 |
| EP | 2007183 3 | 12/2007 |
| EP | 0 657 948 B1 | 2/2008 |
| GB | 2346010 | 7/2000 |
| JP | 60-160181 | 8/1985 |
| JP | 03-209881 | 9/1991 |
| JP | 05-067770 | 3/1993 |
| JP | 05-102518 | 4/1993 |
| JP | 05-110128 | 4/1993 |
| JP | 9-64397 | 3/1997 |
| JP | 10-232910 | 9/1998 |
| JP | 2000-196127 | 7/2000 |
| JP | 2000-223730 | 8/2000 |
| JP | 2001-36120 | 2/2001 |
| JP | 2001-168368 | 6/2001 |
| JP | 2004-342986 | 12/2004 |
| JP | 2005-269627 | 9/2005 |
| JP | 2006-093335 | 4/2006 |
| JP | 2006-344698 | 12/2006 |
| KR | 2003002105 | 1/2003 |
| WO | WO 89/05463 | 6/1989 |
| WO | WO 91/18419 | 11/1991 |
| WO | WO 91/18420 | 11/1991 |
| WO | WO 96/18213 | 6/1996 |
| WO | WO 99/62125 | 12/1999 |
| WO | WO 02/080286 A1 | 10/2002 |
| WO | WO 2005/048310 | 5/2005 |
| WO | WO 2006/042650 | 2/2006 |
| WO | WO 2006/119305 | 9/2006 |
| WO | WO 2006114457 A1 * | 11/2006 |
| WO | WO 2008/045187 | 4/2008 |

OTHER PUBLICATIONS

Aiken et al., "A Loss Analysis for a 28% Efficient 520X Concentrator Module," Conference Record of the 2006 IEEE 4th World Conference on Photovoltaic Energy Conversion, Waikoloa, Hawaii, May 7-12, 2006; pp. 686-689.

Aiken et al., "Consideration of High Bandgap Subcells for Advanced Multijunction Solar Cells," Conference Record of the 2006 IEEE 4th World Conference on Photovoltaic Energy Conversion, Waikoloa, Hawaii, May 7-12, 2006; pp. 838-841.

Aiken et al., "Temperature Dependent Spectral Response Measurements for III-V Multi-junction Solar Cells," 29th IEEE Photovoltaic Specialists Conference, New Orleans, LA, May 19, 2002; pp. 828-831.

Aiken et al., "Development and testing of III-V multijunction-based terrestrial concentrator modules," Conference Record of the Thirty-First IEEE Photovoltaic Specialist Conference, Lake Buena Vista, FL, Jan. 3-7, 2005; pp. 743-746.

Aiken et al., "Design, Manufacturing, and Testing of a Prototype Multijunction Concentrator Module," International Conference on Solar Concentrators for the Generation of Electricity or Hydrogen, Scottsdale, Arizona, May 1-5, 2005; Abstract only, 1 pg.

Aiken et al., "Delivering Known Good Die: High Volume testing of Multijunction Solar Cells for Use in Terrestrial Concentrator Systems," 4th International Conference on Solar Concentrators for the Generation of Electricity or Hydrogen, Mar. 12-16, 2007, San Lorenzo de El Escorial, Spain.

Algora et al., "III-V concentrator solar cells as LEDs," III-Vs Review, The Advanced Semiconductor Magazine, Aug. 2005; 18(6):40-42.

Algora et al., "Strategic options for a LED-like approach in III-V concentrator photovoltaics," Conference Record of the 2006 IEEE 4th World Conference on Photovoltaic Energy Conversion, Waikoloa, Hawaii, May 7-12, 2006; pp. 741-744.

Andreev et al., "Tunnel diode revealing peculiarities at I-V measurements in multijunction III-V solar cells," Conference Record of the 2006 IEEE 4th World Conference on Photovoltaic Energy Conversion, Waikoloa, Hawaii, May 7-12, 2006; pp. 799-802.

Anstey et al., "Progress with the Whitfield Solar PV Concentrator," 4th International Conference on Solar Concentrators for the Generation of Electricity or Hydrogen, Mar. 12-16, 2007, San Lorenzo de El Escorial, Spain; 3 pgs.

Araki et al., "Development of a new 550X concentrator module with 3J cells—performance and reliability," Conference Record of the Thirty-First IEEE Photovoltaic Specialist Conference, Lake Buena Vista, FL; Jan. 3-7, 2005; pp. 631-634.

Araki et al., "Development of concentrator modules with dome-shaped Fresnel lenses and triple junction concentrator cells," Prog. Photovolt.: Res. Appl., Sep. 2005; 13(6):513-527.

Araki et al., "Packaging III-V tandem solar cells for practical terrestrial applications achievable to 27% of module efficiency by conventional machine assemble technology," Sol. Energy Mater. Sol. Cells; Nov. 23, 2006; 90(18-19): 3320-3326.

Araki et al., "A small sun in an ETUI—possibilities in HCPV," Conference Record of the 2006 IEEE 4th World Conference on Photovoltaic Energy Conversion, Waikoloa, Hawaii, May 7-12, 2006; pp. 603-608.

(56) References Cited

OTHER PUBLICATIONS

Araki et al., "Achievement of 27% efficient and 200 Wp concentrator module and the technological roadmap toward realization of more than 31% efficient modules," Sol Energ Mater Sol Cells; Nov. 23, 2006; 90(18-19):3312-3319.

Araki, "500X to 1000X—R&D and Market Strategy of Daido Steel," 4th International Conference on Solar Concentrators for the Generation of Electricity or Hydrogen, Mar. 12-16, 2007, San Lorenzo de El Escorial, Spain, 4 pgs.

Balenzategui et al., "Design of hemispherical cavities for LED-based illumination devices," Applied Physics B (Lasers and Optics), Jan. 2006; 82(1):75-80.

Baudrit et al., "3D modeling of concentrator III-V multi-junction solar cells," Conference Record of the 2006 IEEE 4th World Conference on Photovoltaic Energy Conversion, Waikoloa, Hawaii, May 7-12, 2006; pp. 826-829.

Baudrit et al., "III-V concentrator solar cells simulation: a 2D/3D approach for the design and optimization," 2005 Spanish Conference on Electron Devices; Tarragona Spain, Feb. 2-4, 2005; 4 pgs.

Baudrit et al., "Numerical analysis of GaInP solar cells: toward advanced photovoltaic devices modeling," Proceedings of the 5th International Conference on Numerical Simulation of Optoelectronic Devices, Berlin, Germany; Sep. 19-25, 2005; pp. 41-42.

Baur et al., "Triple junction III-V based concentrator solar cells: Perspectives and challenges," J Sol Energy Eng, Aug. 2007; 129(3):258-265.

Benitez et al., "XR: A High-Performance Photovoltaic Concentrator," 4th International Conference on Solar Concentrators for the Generation of Electricity or Hydrogen, Mar. 12-16, 2007, San Lorenzo de El Escorial, Spain, 4 pgs.

Bett et al., "High-concentration PV using III-V solar cells," Conference Record of the 2006 IEEE 4th World Conference on Photovoltaic Energy Conversion, Waikoloa, Hawaii, May 7-12, 2006; 6 pgs.

Bett et al., "The Needs for Industrialization of CPV Technologies," 4th International Conference on Solar Concentrators for the Generation of Electricity or Hydrogen, Mar. 12-16, 2007, San Lorenzo de El Escorial, Spain, 6 pgs.

Bohmer et al., "Autonomous Polygeneration Solar Concentrator," 4th International Conference on Solar Concentrators for the Generation of Electricity or Hydrogen, Mar. 12-16, 2007, San Lorenzo de El Escorial, Spain, 2 pgs.

Bosi et al., "The Potential of III-V Semiconductors as Terrestrial Photovoltaic Devices," Prog. Photovolt. Res. Appl. 2007; 15:51-68. Published online Jun. 19, 2006.

Brandhorst Jr. et al., "The past, present and future of space photovoltaics," Conference Record of the 2006 IEEE 4th World Conference on Photovoltaic Energy Conversion, Waikoloa, Hawaii, May 7-12, 2006; 6 pgs.

Cancro et al, "Field Testing of the PhoCUS Solar Tracker by Means of a Novel Optoelectronic Device," 4th International Conference on Solar Concentrators for the Generation of Electricity or Hydrogen, Mar. 12-16, 2007, San Lorenzo de El Escorial, Spain, 5 pgs.

Castro et al., "Guascor Foton: Contribution of the Manufacturing of Concentrator PV Systems," 4th International Conference on Solar Concentrators for the Generation of Electricity or Hydrogen, Mar. 12-16, 2007, San Lorenzo de El Escorial, Spain, 4 pgs.

Charache et al., "Moss-Burstein and Plasma Reflection Characteristics of Heavily Doped n-type $In_xGa_{1-x}As$ and $InP_yAs_{1-y}$," J. Appl. Phys., Jul. 1999; 86(1):452-458.

Chellini et al., "Inverters response time with concentration PV systems," 4th International Conference on Solar Concentrators for the Generation of Electricity or Hydrogen, Mar. 12-16, 2007, San Lorenzo de El Escorial, Spain, 4 pgs.

Chemisana et al., "Effect of a secondary linear concentrator on the Si solar cell electrical parameters," 4th International Conference on Solar Concentrators for the Generation of Electricity or Hydrogen, Mar. 12-16, 2007, San Lorenzo de El Escorial, Spain, 4 pgs.

Cole et al., "Front Contact Modeling of Monocrystalline Silicon Laser Grooved Buried Contact Solar Cells," 4th International Conference on Solar Concentrators for the Generation of Electricity or Hydrogen, Mar. 12-16, 2007, San Lorenzo de El Escorial, Spain, 4 pgs.

Conference Record of the 2006 IEEE 4th World Conference on Photovoltaic Energy Conversion, Waikoloa, Hawaii, May 7-12, 2006; 1 pg.

Connolly, "Mirrored strain-balanced quantum well concentrator cells in the radiative limit," $4^{th}$ International Conference on Solar Concentrators for the Generation of Electricity or Hydrogen, Mar. 12-16, 2007, San Lorenzo de El Escorial, Spain, 4 pgs.

Cotal et al., "Outdoor Operation of GaInP/GaAs/Ge Triple Junction Concentrator Solar Cells Up to 1000 Suns," 3rd World Conference on Photovoltaic Energy Conversion, Osaka, Japan, May 11-18, 2003; 4 pgs.

Cotal et al., "Temperature dependence of the IV parameters from triple junction GaInP/InGaAs/Ge concentrator solar cells," Conference Record of the 2006 IEEE 4th World Conference on Photovoltaic Energy Conversion, Waikoloa, Hawaii, May 7-12, 2006; pp. 845-848.

Cotal et al., "The effects of chromatic aberration on the performance of GaInP/GaAs/Ge concentrator solar cells from Fresnel optics," Conference Record of the Thirty-First IEEE Photovoltaic Specialist Conference, Lake Buena Vista, FL, Jan. 3-7, 2005; pp. 747-750.

Cowley et al., "Acceptance angle requirements for point focus CPV Systems," 4th International Conference on Solar Concentrators for the Generation of Electricity or Hydrogen, Mar. 12-16, 2007, San Lorenzo de El Escorial, Spain, 4 pgs.

Dallakyan et al., "Mirror Reflecting Cost Effective PV Solar Energy Concentrating System," 4th International Conference on Solar Concentrators for the Generation of Electricity or Hydrogen, Mar. 12-16, 2007, San Lorenzo de El Escorial, Spain, 3 pgs.

Diaz et al., "PV Systems Based on Very High Concentration: Isofoton Approach for Reaching the Market," 4th International Conference on Solar Concentrators for the Generation of Electricity or Hydrogen, Mar. 12-16, 2007, San Lorenzo de El Escorial, Spain, 4 pgs.

Diaz et al., "ISOSIM: A Multijunction Solar Cell Simulation Program," 4th International Conference on Solar Concentrators for the Generation of Electricity or Hydrogen, Mar. 12-16, 2007, San Lorenzo de El Escorial, Spain, 3 pgs.

Dimroth et al., "High-efficiency solar cells from III-V compound semiconductors," Phys. Status Solid. (c), Mar. 2006; 3(3):373-379.

Dimroth et al., "3-6 junction photovoltaic cells for space and terrestrial concentrator applications," Conference Record of the Thirty-First IEEE Photovoltaic Specialist Conference, Lake Buena Vista, FL, Jan. 3-5, 2005; pp. 525-529.

Dimroth et al., "Hydrogen production in a PV concentrator using III-V multi-junction solar cells," Conference Record of the 2006 IEEE 4th World Conference on Photovoltaic Energy Conversion, Waikoloa, Hawaii, May 7-12, 2006; pp. 640-643.

Dominguez et al., "Characterization of a new solar simulator for concentrator PV modules," $4^{th}$ International Conference on Solar Concentrators for the Generation of Electricity or Hydrogen, Mar. 12-16, 2007, San Lorenzo de El Escorial, Spain, 4 pgs.

Dominguez et al., "Spectral characterization of mini concentrator optics for its use with MJ cells," Conference Record of the 2006 IEEE 4th World Conference on Photovoltaic Energy Conversion, Waikoloa, Hawaii, May 7-12, 2006; 4 pgs.

Eames et al., "The Prediction of the Thermal Behaviour of a Low Concentration Non-Imaging Asymmetric Dielectric Concentrator for Building Facade Applications," 4th International Conference on Solar Concentrators for the Generation of Electricity or Hydrogen, Mar. 12-16, 2007, San Lorenzo de El Escorial, Spain, 4 pgs.

Faiman et al., "Natural sunlight tests at PETAL, of a trial MIM string at concentrations up to 1000X," Conference Record of the 2006 IEEE 4th World Conference on Photovoltaic Energy Conversion, Waikoloa, Hawaii, May 7-12, 2006; 4 pgs.

Faiman et al., "On the survival qualities of an un-encapsulated GaAs dense array CPV module from 1X-1,000X under outdoor tests in the Negev Desert," 4th International Conference on Solar Concentrators for the Generation of Electricity or Hydrogen, Mar. 12-16, 2007, San Lorenzo de El Escorial, Spain, 4 pgs.

(56) References Cited

OTHER PUBLICATIONS

Fatemi et al., "Production of Very High-Efficiency Advanced Triple-Junction (ATJ) Space Solar Cells at Emcore Photovoltaics," presented at the 2003 Space Power Workshop, Torrance, CA, Apr. 24, 2003; 23 pgs.

Feltrin et al., "Material challenges for terawatt level deployment of photovoltaics," Conference Record of the Thirty-First IEEE Photovoltaic Specialist Conference, Lake Buena Vista, FL, Jan. 3-5, 2005; 4 pgs.

"Flatcon® Technology" datasheet [online], Concentrix Solar GmbH, Germany, copyright 2007. Retrieved from the Internet on Nov. 11, 2007: <URL:http://www.concentrixsolar.de/cms/english-flatcontechnology.html>; 2 pgs.

Flores et al., "GaAs Solar Cells on Si Substrates for Concentrator Systems," $20^{th}$ European Photovoltaic Solar Energy Conference, Barcelona, Spain, Jun. 6-10, 2005; 6 pgs.

Fraas et al., "Toward 40% and higher solar cells in a new Cassegrainian PV module," Conference Record of the 31st IEEE Photovoltaic Specialists Conference, Lake Buena Vista, FL, Jan. 3-5, 2005; pp. 751-753.

Fraas et al., "Demonstration of a 33% efficient Cassegrainian solar module," Conference Record of the 2006 IEEE 4th World Conference on Photovoltaic Energy Conversion, Waikoloa, Hawaii, May 7-12, 2006; pp. 679-682.

Fraas et al., "Possible Improvements in the Cassegrainian PV Module," 4th International Conference on Solar Concentrators for the Generation of Electricity or Hydrogen, Mar. 12-16, 2007, San Lorenzo de El Escorial, Spain, 4 pgs.

Fraas et al., "Start-Up of First 100 kW System in Shanghai with 3-Sun PV Mirror Modules," $4^{th}$ International Conference on Solar Concentrators for the Generation of Electricity or Hydrogen, Mar. 12-16, 2007, San Lorenzo de El Escorial, Spain, 4 pgs.

Gabetta et al., "SJ and TJ GaAs concentrator solar cells on Si virtual wafers," Conference Record of the Thirty-First IEEE Photovoltaic Specialist Conference, Lake Buena Vista, FL, Jan. 3-5, 2005; pp. 850-853.

Galiana et al., "Comparison of 1D and 3D analysis of the front contact influence on GaAs concentrator solar cell performance," Sol. Energy Mater. Sol. Cells, Oct. 16, 2006; 90(16):2589-2604.

Galiana et al., "Influence of nucleation layers on MOVPE grown GaAs on Ge wafers for concentrator solar cells," Conference Record of the 2006 IEEE 4th World Conference on Photovoltaic Energy Conversion, Waikoloa, Hawaii, May 7-12, 2006; pp. 807-810.

Galiana et al., "A 3-D model for concentrator solar cells based on distributed circuit units," IEEE Trans. Electron Devices, Dec. 2005; 52(12):2552-2558.

Galiana et al., "A comparative study of BSF layers for GaAs-based single junction or multijunction concentrator solar cells," Semiconductor Science and Technology, Oct. 2006; 21(10):1387-1392.

Garboushian et al., "A Novel High-Concentration PV Technology for Cost Competitive Utility Bulk Power Generation," Proc. 1st World Conference on Photovoltaic Energy Conversion, Hawaii, Dec. 5-9, 1994; pp. 1060-1063.

Garcia et al., "Choices for the epitaxial growth of GaInP/GaAs dual junction concentrator solar cells," 2005 Spanish Conference on Electron Devices, Tarragona, Spain, Feb. 2-4, 2005; 4 pgs.

Garcia et al., "Specific growth and characterization issues in multi-junction solar cells for concentrations above 1000 suns," Conference Record of the 2006 IEEE 4th World Conference on Photovoltaic Energy Conversion, Waikoloa, Hawaii, May 7-12, 2006; pp. 830-833.

Geisz et al., "Toward a monolithic lattice-matched III-V on silicon tandem solar cell," $19^{th}$ European PV Solar Energy Conference and Exhibit, Paris, France, Jun. 7-11, 2004, 7 pgs.

Gonzalez et al., "Analysis of the degradation of high concentrator III-V solar cells," 2005 Spanish Conference on Electron Devices, Tarragona, Spain, Feb. 2-4, 2005, 4 pgs.

Gonzalez, "III-V High Concentrator Solar Cells: Assessing the Reliability of a New Product," 4th International Conference on Solar Concentrators for the Generation of Electricity or Hydrogen, Mar. 12-16, 2007, San Lorenzo de El Escorial, Spain, 4 pgs.

Gordon et al., "Towards a >33% Efficient Photovoltaic Module," 4th International Conference on Solar Concentrators for the Generation of Electricity or Hydrogen, Mar. 12-16, 2007, San Lorenzo de El Escorial, Spain, 4 pgs.

Gordon et al, "Amonix 6th Generation HCPV System," 4th International Conference on Solar Concentrators for the Generation of Electricity or Hydrogen, Mar. 12-16, 2007, San Lorenzo de El Escorial, Spain, 4 pgs.

Grilikhes, "The new approach to design of Fresnel lens sunlight concentrator," 4th International Conference on Solar Concentrators for the Generation of Electricity or Hydrogen, Mar. 12-16, 2007, San Lorenzo de El Escorial, Spain, 4 pgs.

Guter et al. "Tunnel Diodes for III-V Multi-junction Solar Cells," Proc. $20^{th}$ European Photovoltaic Solar Energy Conference and Exhibition, Barcelona, Spain, Jun. 6-10, 2005, 4 pgs.

Harwood et al., "Receiver development for rooftop concentrator applications," 4th International Conference on Solar Concentrators for the Generation of Electricity or Hydrogen, Mar. 12-16, 2007, San Lorenzo de El Escorial, Spain, 4 pgs.

Hayashi et al., "Large Scale Commercialization and Marketing Opportunities for Cost Effective Concentrator PV," 4th International Conference on Solar Concentrators for the Generation of Electricity or Hydrogen, Mar. 12-16, 2007, San Lorenzo de El Escorial, Spain, 3 pgs.

Heasman et al., "Development of laser grooved buried contact solar cells for use at concentration factors up to 100X," 4th International Conference on Solar Concentrators for the Generation of Electricity or Hydrogen, Mar. 12-16, 2007, San Lorenzo de El Escorial, Spain 4 pgs.

Hines, "Trends in the Economics of Solar Concentrators," 4th International Conference on Solar Concentrators for the Generation of Electricity or Hydrogen, Mar. 12-16, 2007, San Lorenzo de El Escorial, Spain, 6 pgs.

"Isofoton Concentration Systems" datasheet/manual [online], Isofoton, Malaga, Spain, Sep. 2003. Retrieved from the internet on Nov. 1, 2007: <URL:http://www.isofoton.com/technicalhtml/secciones/desarrolos/sistemas.asp>; 49 pgs.

Johnson Jr., "Hybrid Optic Design for Concentrator Panels," 4th International Conference on Solar Concentrators for the Generation of Electricity or Hydrogen, Mar. 12-16, 2007, San Lorenzo de El Escorial, Spain, 4 pgs.

Karvelas et al., "Mirrors based on total reflection for concentration PV panels," 4th International Conference on Solar Concentrators for the Generation of Electricity or Hydrogen, Mar. 12-16, 2007, San Lorenzo de El Escorial, Spain, 4 pgs.

Katz et al., "Mapping Concentrator Solar Cell Properties by Localized Irradiation at Ultrahigh Flux," 4th International Conference on Solar Concentrators for the Generation of Electricity or Hydrogen, Mar. 12-16, 2007, San Lorenzo de El Escorial, Spain, 4 pgs.

Khuchua et al., "Prospects for GaAs Solar Cells with a New Type Concentrator," 20th European Photovoltaic Solar Energy Conference, Jun. 6-10, 2005, Barcelona, Spain, 5 pgs.

King et al., "40% efficient metamorphic GaInP/GaInAs/Ge multijunction solar cells," Appl. Phys. Lett., 2007; 90(18):183516-1-183516-3. Published online May 4, 2007.

King et al., "Metamorphic and lattice-matched solar cells under concentration," Conference Record of the 2006 IEEE 4th World Conference on Photovoltaic Energy Conversion, Waikoloa, Hawaii, May 7-12, 2006; pp. 760-763.

King et al., "Metamorphic Concentrator Solar Cells with Over 40% Conversion Efficiency," $4^{th}$ International Conference on Solar Concentrators for the Generation of Electricity or Hydrogen, Mar. 12-16, 2007, San Lorenzo de El Escorial, Spain, 4 pgs.

King et al. "High-efficiency space and terrestrial multijunction solar cells through bandgap control in cell structures," Conference Records of the $29^{th}$ IEEE Photovoltaic Specialist Conference, New Orleans, LA, May 19, 2002; pp. 776-781.

Kinsey et al., "Multijunction solar cells for dense-array concentrators," Conference Record of the 2006 IEEE 4th World Conference on Photovoltaic Energy Conversion, Waikoloa, Hawaii, May 7-12, 2006; 3 pgs.

(56) References Cited

OTHER PUBLICATIONS

Kippelen, "Organic Photovoltaics: Ground-Based Telescopes for the 21$^{st}$ Century," Optics & Photonics News, Oct. 2007, pp. 28-33.
Klotz et al, "Integrated Parabolic Trough (IPT) for Low Concentration PV Systems," 4$^{th}$ International Conference on Solar Concentrators for the Generation of Electricity or Hydrogen, Mar. 12-16, 2007, San Lorenzo de El Escorial, Spain, 4 pgs.
Korech et al., "High-Flux Characterization of Ultra-Small Triple-Junction Concentrator Solar Cells," 4th International Conference on Solar Concentrators for the Generation of Electricity or Hydrogen, Mar. 12-16, 2007, San Lorenzo de El Escorial, Spain, 4 pgs.
Kotsovos et al., "Crystalline silicon solar cell design optimized for concentrator applications," 4$^{th}$ International Conference on Solar Concentrators for the Generation of Electricity or Hydrogen, Mar. 12-16, 2007, San Lorenzo de El Escorial, Spain, 4 pgs.
Kribus et al., "Practical cogeneration with concentrating PV," 4th International Conference on Solar Concentrators for the Generation of Electricity or Hydrogen, Mar. 12-16, 2007, San Lorenzo de El Escorial, Spain, 4 pgs.
Kurtz et al., "A New GaInP/GaAs/GaInAs, Triple-Bandgap, Tandem Solar Cell for High-Efficiency Terrestrial Concentrator Systems," Report No. NREL/CP-520-38997; Presented at the 2005 DOE Solar Energy Technologies Program Review Meeting, Nov. 7-10, 2005, Denver, CO; 5 pages.
Kurtz et al., "Using MOVPE growth to generate tomorrow's solar electricity," J. Cryst. Growth, Jan. 2007; 298:748-753.
Kurtz et al., "A Comparison of Theoretical and Experimental Efficiencies of Concentrator Solar Cells," 4th International Conference on Solar Concentrators for the Generation of Electricity or Hydrogen, Mar. 12-16, 2007, San Lorenzo de El Escorial, Spain, 6 pgs.
Kusek et al., "Description and Performance of the MicroDish Concentrating Photovoltaic System," 4th International Conference on Solar Concentrators for the Generation of Electricity or Hydrogen, Mar. 12-16, 2007, San Lorenzo de El Escorial, Spain, 4 pgs.
Lasich et al., "Opportunities for widespread implementation of concentrator photovoltaic (CPV) Systems," 4th International Conference on Solar Concentrators for the Generation of Electricity or Hydrogen, Mar. 12-16, 2007, San Lorenzo de El Escorial, Spain, 6 pgs.
Lee et al., "Field test and analysis: the behavior of 3-J concentrator cells under the control of cell temperature," Conference Record of the Thirty-First IEEE Photovoltaic Specialist Conference, Lake Buena Vista, FL, Jan. 3-5, 2005, pp. 754-757.
Lerchenmuller et al., "From FLATCON® Pilot Systems to the first Power Plant," 4th International Conference on Solar Concentrators for the Generation of Electricity or Hydrogen, Mar. 12-16, 2007, San Lorenzo de El Escorial, Spain, 4 pgs.
Lerchenmuller et al., "Cost and Market Perspectives for FLATCON®-Systems," International Conference on Solar Concentrators for the Generation of Electricity or Hydrogen, Scottsdale, AZ, May 1-5, 2005, 3 pgs.
Leutz, "Nonimaging Flat Fresnel Lenses," 4th International Conference on Solar Concentrators for the Generation of Electricity or Hydrogen, Mar. 12-16, 2007, San Lorenzo de El Escorial, Spain, 4 pgs.
Leutz et al., "Segmented Cone Concentrators: Optical Design," 4th International Conference on Solar Concentrators for the Generation of Electricity or Hydrogen, Mar. 12-16, 2007, San Lorenzo de El Escorial, Spain, 4 pgs.
Li et al., "Development of 1.25 eV InGaAsN for Triple Junction Solar Cells," 28th IEEE Photovoltaic Specialists Conference, Anchorage, Alaska, Sep. 15-22, 2000, 4 pgs.
Loeckenhoff et al., "1000 sun, compact receiver based on monolithic interconnected modules (MIMS)," Conference Record of the 2006 IEEE 4th World Conference on Photovoltaic Energy Conversion, Waikoloa, Hawaii, May 7-12, 2006; pp. 737-740.
Luque et al., "Concentrators: The Path to Commercialization of the Novel Sophisticated Ultra High Efficiency Solar Cells," 4th International Conference on Solar Concentrators for the Generation of Electricity or Hydrogen, Mar. 12-16, 2007, San Lorenzo de El Escorial, Spain, 6 pgs.
Luque et al., Ed. Sections 9.8 and 9.9 "High-Efficiency III-V Multijunction Solar Cells," and Chapter 11 "Photovoltaic Concentrators," *Handbook of Photovoltaic Science and Engineering*, John Wiley & Sons, Ltd., Hoboken, NJ, Jul. 7, 2003; 64 pgs.
Luque et al., "FULLSPECTRUM: a new PV wave making more efficient use of the solar spectrum," Sol. Energy Mater. Sol. Cells, May 2005; 87(1-4):467-479.
Luque-Heredia et al., "CPV Tracking Systems: Performance Issues, Specification and Design," 4$^{th}$ International Conference on Solar Concentrators for the Generation of Electricity or Hydrogen, Mar. 12-16, 2007, San Lorenzo de El Escorial, Spain, 7 pgs.
Lynch et al., "Spectral response and I-V characteristics of large well number multi quantum well solar cells," Journal of Materials Science, Mar. 2005; 40(6):1445-1449.
Madrid et al., "Investigation of the efficiency boost due to spectral concentration in a quantum-dot based luminescent concentrator," Conference Record of the 2006 IEEE 4th World Conference on Photovoltaic Energy Conversion, Waikoloa, Hawaii, May 7-12, 2006; 4 pgs.
Mallick et al., "Optical Performance Predictions for a High Concentration Point Focus Photovoltaic System," 4th International Conference on Solar Concentrators for the Generation of Electricity or Hydrogen, Mar. 12-16, 2007, San Lorenzo de El Escorial, Spain, 4 pgs.
Martinez et al., "Prediction of PV concentrators energy production: Influence of wind in the cooling mechanisms. First steps," 4th International Conference on Solar Concentrators for the Generation of Electricity or Hydrogen, Mar. 12-16, 2007, San Lorenzo de El Escorial, Spain, 4 pgs.
Mazzer et al., "Progress in quantum well solar cells," Thin Solid Films, Jul. 26, 2006; 511-512:76-83.
McConnell et al., "Multijunction photovoltaic technologies for high-performance concentrators," Conference Record of the 2006 IEEE 4th World Conference on Photovoltaic Energy Conversion, Waikoloa, Hawaii, May 7-12, 2006; 4 pgs.
McConnell et al., "Concentrator Photovoltaic Standards," 4th International Conference on Solar Concentrators for the Generation of Electricity or Hydrogen, Mar. 12-16, 2007, San Lorenzo de El Escorial, Spain, 4 pgs.
McMahon et al., "Outdoor Testing of GaInP$_2$/GaAs Tandem Cells with Top Cell Thickness Varied," International Conference on Solar Concentrators for the Generation of Electricity or Hydrogen, Scottsdale, Arizona, May 1-5, 2005, 4 pgs.
Meusel et al., "Characterization of monolithic III-V multi-junction solar cells—challenges and application," Sol. Energy Mater. Sol. Cells, Nov. 23, 2006; 90:3268-3275.
Morilla et al., "Technology Improvements in Buried Contact Cells Optimised for Concentration Systems," 4th International Conference on Solar Concentrators for the Generation of Electricity or Hydrogen, Mar. 12-16, 2007, San Lorenzo de El Escorial, Spain, 4 pgs.
Newman et al., "Terrestrial Solar Cell Development at Emcore and Roadmap to Achieving Higher Performance," 4th International Conference on Solar Concentrators for the Generation of Electricity or Hydrogen, Mar. 12-16, 2007, San Lorenzo de El Escorial, Spain, 4 pgs.
Nishioka et al., "Annual output estimation of concentrator photovoltaic systems using high-efficiency InGaP/InGaAs/Ge triple-junction solar cells based on experimental solar cell's characteristics and field-test meteorological data," Sol. Energy Mater. Sol. Cells, Jan. 6, 2006; 90(1):57-67.
Nishioka et al., "Evaluation of InGaP/InGaAs/Ge triple-junction solar cell and optimization of solar cell's structure focusing on series resistance for high-efficiency concentrator photovoltaic systems," Sol. Energy Mater. Sol. Cells, May 23, 2006; 90(9):1308-1321.
Nishioka et al., "Evaluation of temperature characteristics of high-efficiency InGaP/InGaAs/Ge triple junction solar cells under concentration," Sol. Energy Mater. Sol. Cells, Jan. 2005; 85:429-436.
Nitz et al, "Indoor Characterization of Fresnel Type Concentrator Lenses," 4th International Conference on Solar Concentrators for the Generation of Electricity or Hydrogen, Mar. 12-16, 2007, San Lorenzo de El Escorial, Spain, 4 pgs.
O'Neill, "Advances in Color-Mixing Lens/Multi-junction Cell (CML/MJC) Concentrators for Space and Ground Power," 4th Inter-

(56) References Cited

OTHER PUBLICATIONS national Conference on Solar Concentrators for the Generation of Electricity or Hydrogen, Mar. 12-16, 2007, San Lorenzo de El Escorial, Spain, 4 pgs.
Ortabasi et al., "Dish/Photovoltaics Cavity Converter (PVCC) System for Ultimate Solar-to-Electricity Conversion Efficiency General Concept and First Performance Predictions," 29th IEEE Photovoltaic Specialists Conference, New Orleans, LA, May 19, 2002, 5 pgs.
Parretta et al., "Fluxmeter for Parabolic Trough Solar Concentrators," 4th International Conference on Solar Concentrators for the Generation of Electricity or Hydrogen, Mar. 12-16, 2007, San Lorenzo de El Escorial, Spain, 4 pgs.
Parretta et al., "Fluxmeter for Point-Focus Solar Concentrators," 4th International Conference on Solar Concentrators for the Generation of Electricity or Hydrogen, Mar. 12-16, 2007, San Lorenzo de El Escorial, Spain, 4 pgs.
Pereles et al., "High Concentration PV System," 4th International Conference on Solar Concentrators for the Generation of Electricity or Hydrogen, Mar. 12-16, 2007, San Lorenzo de El Escorial, Spain, 3 pgs.
Perez et al., "Multi-Trackers Systems. Calculation of losses due to self-shadowing," $4^{th}$ International Conference on Solar Concentrators for the Generation of Electricity or Hydrogen, Mar. 12-16, 2007, San Lorenzo de El Escorial, Spain, 4 pgs.
Qiu et al., "Thermophotovoltaic power generation systems using natural gas-fired radiant burners," Sol Energy Mater. Sol. Cells, Apr. 16, 2007; 91(7):588-596.
Rasello et al., "Comparison between Different Solar Concentrators as regards to the Electric Generation," 4th International Conference on Solar Concentrators for the Generation of Electricity or Hydrogen, Mar. 12-16, 2007, San Lorenzo de El Escorial, Spain, 4 pgs.
Rey-Stolle et al., "Assessment of a low-cost gold-free metallization for III-V high concentrator solar cells," Solar Energy Materials and Solar Cells, May 23, 2007; 91(9):847-850.
Roca et al., "Development and Performance Analysis of the PhoCUS C-Module, 4th International Conference on Solar Concentrators for the Generation of Electricity or Hydrogen," Mar. 12-16, 2007, San Lorenzo de El Escorial, Spain, 4 pgs.
Rubin et al., "DAY4™ PV Receivers and Heat Sinks for Sun Concentration Applications," $4^{th}$ International Conference on Solar Concentrators for the Generation of Electricity or Hydrogen, Mar. 12-16, 2007, San Lorenzo de El Escorial, Spain, 4 pgs.
Rubio et al., "Establishment of the Institute of Concentration Photovoltaic Systems—ISFOC," 4th International Conference on Solar Concentrators for the Generation of Electricity or Hydrogen, Mar. 12-16, 2007, San Lorenzo de El Escorial, Spain, 2 pgs.
Rumyantsev et al., "Terrestrial concentrator PV modules based on GaInP/GaAs/Ge TJ cells and minilens panels," Conference Record of the 2006 IEEE 4th World Conference on Photovoltaic Energy Conversion, Waikoloa, Hawaii, May 7-12, 2006; pp. 632-635.
Rumyantsev et al., "'Solar concentrator modules with fresnel lens panels", 4th International Conference on Solar Concentrators for the Generation of Electricity or Hydrogen, Mar. 12-16, 2007, San Lorenzo de El Escorial, Spain, 4 pgs.
Rumyantsev et al., "Indoor Characterization of Multijunction Concentrator Cells Under Flash Illumination with Variable Spectrum," 4th International Conference on Solar Concentrators for the Generation of Electricity or Hydrogen, Mar. 12-16, 2007, San Lorenzo de El Escorial, Spain, 4 pgs.
Sarno et al., "Enea's Experience on the PV-Concentrators Technology: The PhoCUS Project," 4th International Conference on Solar Concentrators for the Generation of Electricity or Hydrogen, Mar. 12-16, 2007, San Lorenzo de El Escorial, Spain, 4 pgs.
Sharps et al., "AlGaAs/InGaAlP Tunnel Junctions for Multi-junction Solar Cells," 28th IEEE Photovoltaic Specialists Conference, Anchorage, Alaska, Sep. 15-22, 2000; pp. 1185-1188.
Sharps et al., "Electron and Proton Radiation Study of GaInP$_2$/GaAs/Ge Solar Cell," $17^{th}$ European Photovoltaic Solar Energy Conference, Munich, Germany, Oct. 22-26, 2001, 4 pgs.
Sharps et al., "Ultra high-efficiency advanced triple junction (ATJ) solar cell production at Emcore Photovoltaics," $37^{th}$ Intersociety Energy Conversion Engineering Conference, Jul. 29-31, 2002, Abstract only, 1 pg.
Sharps et al., "Modeling and Testing of Multi-junction Solar Cell Reliability," Presented at the 2003 Space Power Workshop, Torrance, CA, Apr. 25, 2003, Emcore Corporation, 19 pgs.
Sharps et al., "Proton and Electron Radiation Analysis of GaInP$_2$/GaAs Solar Cells," $28^{th}$ IEEE Photovoltaic Specialists Conference, Anchorage, Alaska, Sep. 15-22, 2000, 4 pgs.
Sherif et al., "First demonstration of multi-junction receivers in a grid-connected concentrator module," Conference Record of the Thirty-First IEEE Photovoltaic Specialist Conference, Lake Buena Vista, FL, Jan. 3-7, 2005; pp. 635-638.
Shin et al., "The Development of a 5kW HCPV Systems at INER," 4th International Conference on Solar Concentrators for the Generation of Electricity or Hydrogen, Mar. 12-16, 2007, San Lorenzo de El Escorial, Spain, 3 pgs.
Shvarts et al., "Space Fresnel lens concentrator modules with triple-junction solar cells," Conference Record of the Thirty-First IEEE Photovoltaic Specialist Conference, Lake Buena Vista, FL, Jan. 3-7, 2005; pp. 818-821.
Shvarts et al., "Indoor Characterization of the Multijunction III-V Solar Cells and Concentrator Modules," European Photovoltaic Solar Energy Conference, Barcelona, Spain, Jun. 6-10, 2005, 4 pgs.
Siefer et al., "Calibration of III-V concentrator cells and modules," Conference Record of the 2006 IEEE 4th World Conference on Photovoltaic Energy Conversion, Waikoloa, Hawaii, May 7-12, 2006; pp. 745-748.
Sinharoy et al., "Progress in the Development of Metamorphic Multi-Junction III-V Space Solar Cells," Prog. Photovolt. Res. Appl., Sep. 2002; 10(6):427-432. Published online Aug. 27, 2002.
Slade et al., "High Efficiency Solar Cells for Concentrator Systems: Silicon or Multi-Junction?" SPIE Optics and Photonics, San Diego, CA, Aug. 2005; 8 pgs.
Slade et al., "A Comparison of Concentrator Cell Technologies," 4th International Conference on Solar Concentrators for the Generation of Electricity or Hydrogen, Mar. 12-16, 2007, San Lorenzo de El Escorial, Spain, 4 pgs.
"Sol Focus SF-CPV-2005 High Efficiency Concentrator PV Panel" datasheet, Sol Focus, Inc., Palo Alto, CA. Copyright 2007. Retrieved from the Internet on Nov. 1, 2007: <URL:http://www.solfocus.com/technology_gen1.html>; 7 pgs.
Stan et al., "InGaP/InGaAs/Ge high concentration solar cell development at Emcore," Conference Record of the Thirty-first IEEE Photovoltaic Specialists Conference, Lake Buena Vista, FL, Jan. 3-7, 2005, pp. 770-773.
Stan et al., "27.5% Efficiency InGaP/InGaAs/Ge Advanced Triple Junction (ATJ) Space Solar Cells for High Volume Manufacturing," 29th IEEE Photovoltaic Specialists Conference, New Orleans, May 19, 2002, 4 pgs.
Stefrancich et al., "Optical tailoring of flat faceted collector for optimal flux distribution on CPV receiver," 4th International Conference on Solar Concentrators for the Generation of Electricity or Hydrogen, Mar. 12-16, 2007, San Lorenzo de El Escorial, Spain, 4 pgs.
Stone et al., "Design & Performance of the Amonix High Concentration Solar PV System," ASES/ASME National Solar Energy Conference, Reno, NV, Jun. 15-20, 2002, 7 pgs.
Stone et al., "Operation of 350 kW of Amonix High Concentration PV Systems at Arizona Public Service," ASME 2003 International Solar Energy Conference, Kohala Coast, Hawaii, Mar. 15-18, 2003, 6 pgs.
Swinkels et al., "Energy Conversion of Concentrated Near Infrared Radiation in a Solar Greenhouse," 4th International Conference on Solar Concentrators for the Generation of Electricity or Hydrogen, Mar. 12-16, 2007, San Lorenzo de El Escorial, Spain, 4 pgs.
Symko-Davies et al., "Research Initiatives on High-Efficiency Low-Cost Concentrator Photovoltaics," 4th International Conference on Solar Concentrators for the Generation of Electricity or Hydrogen, Mar. 12-16, 2007, San Lorenzo de El Escorial, Spain, 4 pgs.
Takamoto et al., "InGaP/GaAs-based multijunction solar cells," Prog Photovoltaics Res Appl; Sep. 2005; 13(6):495-511.

(56) References Cited

OTHER PUBLICATIONS

Takamoto et al., "Concentrator compound solar cells," Sharp Technical Journal, Dec. 2005; 93:49-53.
Takamoto et al., "Future development of InGaP/(In)GaAs based multijunction solar cells," Conference Record of the Thirty-First IEEE Photovoltaic Specialist Conference, Lake Buena Vista, FL, Jan. 3-7, 2005, pp. 519-524.
Tomita et al., "Blazing a new path to the future," Conference Record of the 2006 IEEE 4th World Conference on Photovoltaic Energy Conversion, Waikoloa, Hawaii, May 7-12, 2006; pp. 2451-2453.
Tripanagnostopoulos, "Linear Fresnel Lenses With Photovoltaics for Cost Effective Electricity Generation and Solar Control of Buildings," 4th International Conference on Solar Concentrators for the Generation of Electricity or Hydrogen, Mar. 12-16, 2007, San Lorenzo de El Escorial, Spain, 4 pgs.
Tzeng et al., "Status of concentration type III-V solar cell development at INER Taiwan," 4th International Conference on Solar Concentrators for the Generation of Electricity or Hydrogen, Mar. 12-16, 2007, San Lorenzo de El Escorial, Spain, 4 pgs.
Tzeng et al., "The development of an 1kW HCPV system at INER," Conference Record of the 2006 IEEE 4th World Conference on Photovoltaic Energy Conversion, Waikoloa, Hawaii, May 7-12, 2006; pp. 648-650.
Vallribera et al., "Technical highlights of a solar simulator for high concentration PV modules," 4th International Conference on Solar Concentrators for the Generation of Electricity or Hydrogen, Mar. 12-16, 2007, San Lorenzo de El Escorial, Spain, 3 pgs.
van Reisen et al., "Degradation study of III-V solar cells for concentrator application," Prog. Photovolt., Res. Appl., Aug. 2005; 13(5):369-380.
Venkatasubramanian et al., "An Inverted-Growth Approach to Development of an IR-Transparent, High-Efficiency AlGaAs/GaAs Cascade Solar Cell," Conference Record of the $22^{nd}$ IEEE Photovoltaic Specialists Conference, Las Vegas, NV, Oct. 7-11, 1991; pp. 93-98.
Verlinden et al., "Performance and reliability of multijunction III-V modules for concentrator dish and central receiver applications," Conference Record of the 2006 IEEE 4th World Conference on Photovoltaic Energy Conversion, Waikoloa, Hawaii, May 7-12, 2006; pp. 592-597.
Vivar et al., "Third Generation of EUCLIDES System: First results and modelling of annual production in IDEOCONTE project test sites," 4th International Conference on Solar Concentrators for the Generation of Electricity or Hydrogen, Mar. 12-16, 2007, San Lorenzo de El Escorial, Spain, 4 pgs.
Vlasov et al., "TPV systems with solar powered tungsten emitters," Seventh World Conference on Thermophotovoltaic Generation of Electricity, AIP Conference Proceedings, Feb. 2007, vol. 890, pp. 327-334.
Vossier et al., "Experimental Test and Modelling of Concentrator Solar Cells Under Medium and High Fluxes," 4th International Conference on Solar Concentrators for the Generation of Electricity or Hydrogen, Mar. 12-16, 2007, San Lorenzo de El Escorial, Spain, 4 pgs.
Wanlass et al., GaInP/GaAs/GaInAs Monolithic Tandem Cells for High-Performance Solar Concentrators, International Conference on Solar Concentrators for the Generation of Electricity or Hydrogen, Scottsdale, AZ, May 1-5, 2005, 4 pgs.
Wanlass et al., "Lattice-Mismatched Approaches for High-Performance, III-V Photovoltaic Energy Converters," 31st IEEE Photovoltaics Specialists Conference and Exhibition, Lake Buena Vista, FL, Jan. 3-7, 2005, 9 pgs.
Winston, "Concentrator Optics for Photovoltaics," 4th International Conference on Solar Concentrators for the Generation of Electricity or Hydrogen, Mar. 12-16, 2007, San Lorenzo de El Escorial, Spain, 2 pgs.
Wu et al., "Optical Analysis of Asymmetric Compound Parabolic Photovoltaic Concentrators (ACPPVC) Suitable for Building Facade Integration," 4th International Conference on Solar Concentrators for the Generation of Electricity or Hydrogen, Mar. 12-16, 2007, San Lorenzo de El Escorial, Spain, 4 pgs.
Yamaguchi et al., "Super high-efficiency multi-junction and concentrator solar cells," Sol. Energy Mater. Sol. Cells, Nov. 23, 2006; 90(18-19):3068-3077.
Yamaguchi et al., "Super-high-efficiency multi-junction solar cells," Prog. Photovolt., Res. Appl., Mar. 2005; 13(2):125-132.
Yamaguchi et al., "Multi-junction III-V solar cells: current status and future potential," Sol. Energy, Jul. 2005; 79(1):78-85.
Yeh et al., "Hybrid mode tracking control mechanism used in HCPV tracker," 4th International Conference on Solar Concentrators for the Generation of Electricity or Hydrogen, Mar. 12-16, 2007, San Lorenzo de El Escorial, Spain, 4 pgs.
4th International Conference on Solar Concentrators for the Generation of Electricity or Hydrogen, Mar. 12-16, 2007, San Lorenzo de El Escorial, Spain. Sessions Index, 11 pgs.
Office Action dated Oct. 15, 2007 for U.S. Appl. No. 11/830,636.
Office Action dated Jan. 26, 2009 for U.S. Appl. No. 12/191,142.
Office Action dated Mar. 31, 2011 for U.S. Appl. No. 12/703,561.
Notice of Allowance dated Mar. 9, 2009 for U.S. Appl. No. 12/264,369.
European Search Report dated Mar. 10, 2009 for European Patent Application No. 08017412.1-1528.
Portuguese Search Report dated Jun. 2, 2008 for Portuguese Patent Application No. 103890.
Collection of Abstracts, vol. 1, Patent Literature (List of items abstracted as Search 1; 2804 pgs in 4 parts.).
Collection of Abstracts, vol. 2, Non-Patent Literature (List of items abstracted as Search 2; 202 pgs.)
Collection of Abstracts, vol. 3, Patent Literature (List of items abstracted as Search 2; 554 pgs.).
Collection of Abstracts, vol. 4, Non-Patent Literature (List of items abstracted as Search 2; 306 pgs.)

* cited by examiner

SOLAR CELL RECEIVER SUBASSEMBLY WITH A HEAT SHIELD FOR USE IN A CONCENTRATING SOLAR SYSTEM

RELATED APPLICATIONS

This application is a continuation-in-part of U.S. application Ser. No. 12/553,813, filed on Sep. 3, 2009, the contents of which are incorporated herein by reference in its entirety.

The disclosure of this application is related to U.S. application Ser. No. 12/485,684, filed on Jun. 16, 2009; U.S. application Ser. No. 12/246,295, filed on Oct. 6, 2008; U.S. application Ser. No. 12/069,642 filed on Feb. 11, 2008; U.S. application Ser. No. 12/264,369, filed on Nov. 4, 2008 which is a divisional of Ser. No. 12/069,642; U.S. application Ser. No. 11/849,033, filed on Aug. 31, 2007; U.S. application Ser. No. 11/830,576, filed on Jul. 30, 2007; and U.S. application Ser. No. 11/500,053, filed on Aug. 7, 2006; the contents of each are incorporated herein by reference in their entirety.

FIELD OF THE INVENTION

The present application is directed to a solar cell receiver subassembly for use in a concentrating solar system, more particularly, to a solar cell receiver subassembly with a heat shield to protect elements of the subassembly from concentrated solar energy.

BACKGROUND

Historically, solar power (both in space and terrestrially) has been predominantly provided by silicon solar cells. In the past several years, however, high-volume manufacturing of high-efficiency III-V compound semiconductor multijunction solar cells for space applications has enabled the consideration of this alternative technology for terrestrial power generation. Compared to silicon, III-V compound semiconductor multijunction cells are generally more radiation resistant and have greater energy conversion efficiencies, but they tend to cost more to manufacture. Some current III-V compound semiconductor multijunction cells have energy efficiencies that exceed 27%, whereas silicon technologies generally reach only about 17% efficiency. Under concentration, some current III-V compound semiconductor multijunction cells have energy efficiencies that exceed 37%.

Generally speaking, the multijunction cells are of n-on-p polarity and are composed of a vertical stack of InGaP/(In)GaAs/Ge semiconductor structures. The III-V compound semiconductor multijunction solar cell layers are typically grown via metal-organic chemical vapor deposition (MOCVD) on germanium (Ge) substrates. The use of the Ge substrate permits a junction to be formed between n- and p-type Ge, thereby utilizing the substrate for forming the bottom or low band gap subcell. The solar cell structures are typically grown on 100-mm diameter Ge wafers with an average mass density of about 86 mg/cm$^2$. In some processes, the epitaxial layer uniformity across a platter that holds 12 or 13 Ge substrates during the MOCVD growth process is better than 99.5%. The epitaxial wafers can subsequently be processed into finished solar cell devices through automated robotic photolithography, metallization, chemical cleaning and etching, antireflection (AR) coating, dicing, and testing processes. The n- and p-contact metallization is typically comprised of predominately Ag with a thin Au cap layer to protect the Ag from oxidation. The AR coating is a dual-layer $TiO_x/Al_2O_3$ dielectric stack, whose spectral reflectivity characteristics are designed to minimize reflection at the cover-glass-interconnect-cell (CIC) or solar cell assembly (SCA) level, as well as, maximizing the end-of-life (EOL) performance of the cells.

In some compound semiconductor multijunction cells, the middle cell is an InGaAs cell as opposed to a GaAs cell. The indium concentration may be in the range of about 1.5% for the InGaAs middle cell. In some implementations, such an arrangement exhibits increased efficiency. The advantage in using InGaAs layers is that such layers are substantially better lattice matched to the Ge substrate.

SUMMARY

The present application is directed to solar cell receiver subassemblies for use in a concentrating solar system that concentrates the solar energy onto a solar cell for converting solar energy to electricity. The subassemblies may include an optical element defining an optical channel and forming an optical path. The subassemblies may also include a solar cell receiver comprising a support and a solar cell mounted on the support adjacent to the optical element and in the optical path of the optical channel. The solar cell may include one or more III-V compound semiconductor layers and may be capable of generating in excess of 20 watts of peak DC power. The subassemblies may also include a heat shield mounted over and peripherally adjacent to exterior sides of the optical element to cover and block concentrated light from reaching a surface of the support adjacent to the solar cell.

Some embodiments may incorporate or implement fewer of the aspects or features noted in the foregoing summaries.

The present invention is not limited to the above features and advantages. Those skilled in the art will recognize additional features and advantages upon reading the following detailed description, and upon viewing the accompanying drawings.

DETAILED DESCRIPTION

Figure 1:
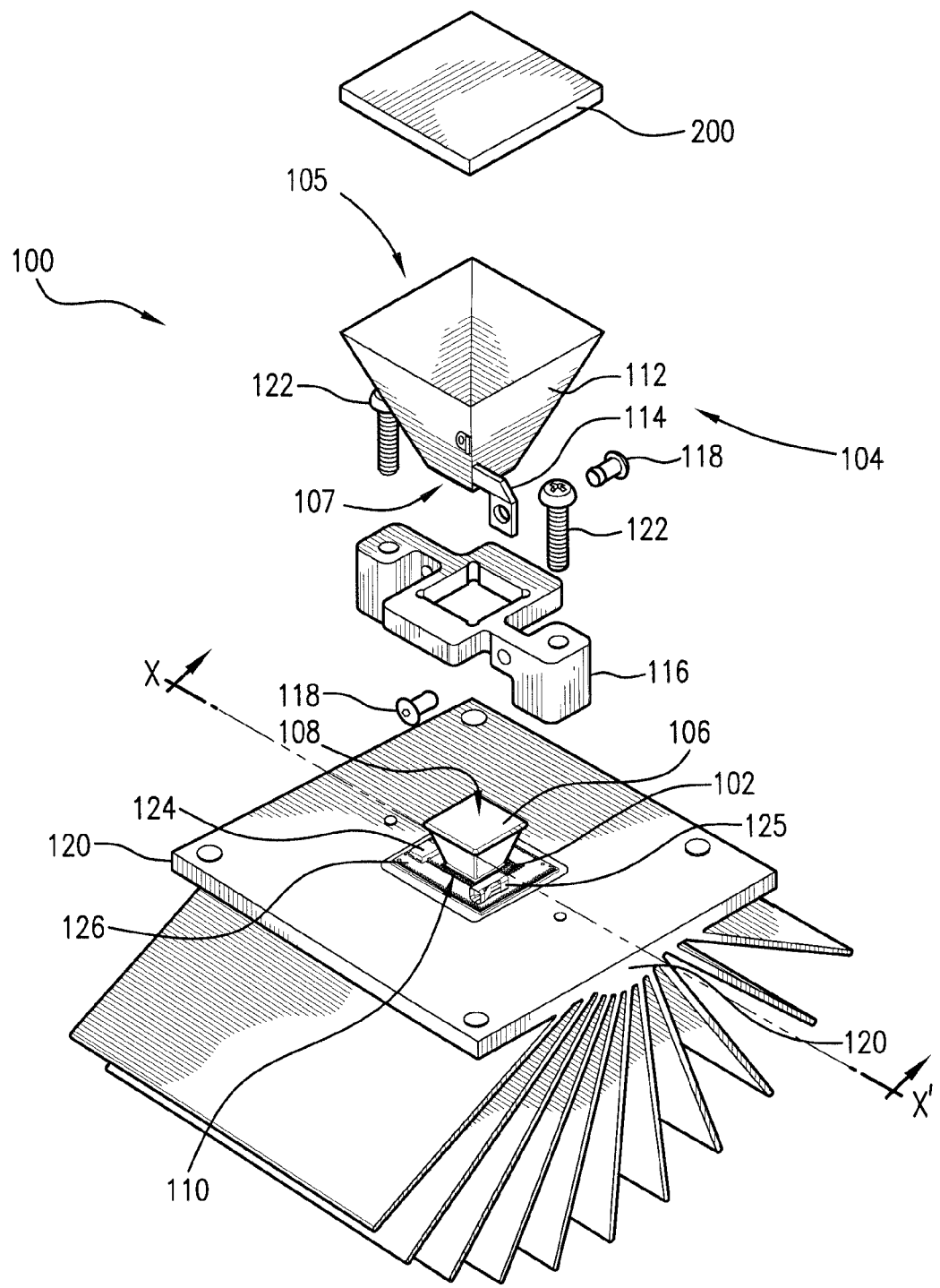
FIG. 1 is a partially exploded perspective view of an embodiment of a solar cell receiver including a solar cell, a metalized ceramic substrate and a heat sink positioned relative to a primary focusing element.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

Solar cell receivers include a solar cell for converting solar energy into electricity. In various implementations described herein, a triple-junction III-V compound semiconductor solar cell is employed, but other types of solar cells could be used depending upon the application. Solar cell receivers often contain additional components, e.g., connectors for coupling to an output device or other solar cell receivers.

For some applications, a solar cell receiver may be implemented as part of a solar cell module. A solar cell module may include a solar cell receiver and a lens coupled to the solar cell receiver. The lens is used to focus received light onto the solar cell receiver. As a result of the lens, a greater concentration of solar energy can be received by the solar cell receiver. In some implementations, the lens is adapted to concentrate solar energy by a factor of 400 or more. For example, under 500-Sun concentration, 1 $cm^2$ of solar cell area produces the same amount of electrical power as 500 $cm^2$ of solar cell area would, without concentration. The use of concentration, therefore, allows substitution of cost-effective materials such as lenses and mirrors for the more costly semiconductor cell material. Two or more solar cell modules may be grouped together into an array. These arrays are sometimes referred to as "panels" or "solar panels."

FIG. 1 illustrates an embodiment of a solar cell receiver 100 including a solar cell 102. In one embodiment, the solar cell 102 is a triple-junction III-V compound semiconductor solar cell which comprises a top cell, a middle cell and a bottom cell arranged in series. In another embodiment, the solar cell 102 is a multijunction solar cell having n-on-p polarity and is composed of InGaP/(In)GaAs III-V compounds on a Ge substrate. The light received by the solar cell receiver 100 may initially pass through various components, including a lens 200, a secondary optical element 104, and a concentrator 106. Various embodiments may include different combinations and arrangements of components. Some embodiments may include fewer components. In some embodiments, the light passes through a single component prior to reaching the solar cell 102.

The lens 200 concentrates light towards the solar cell receiver 100. The distance between the lens 200 and the solar cell receiver 100 may vary depending upon the specific construction of each, and/or the overall construction of the solar module. The lens 200 may be Fresnel lenses, or may be conventional spherical lenses. An advantage of Fresnel lenses is that they require less material compared to a conventional spherical lens. In one embodiment, the lens 200 has a rectangular shape. In one more specific embodiment, the lens 200 is 9 inches by 9 inches. The lens 200 may be made from various materials, including but not limited to acrylic, plastic, and glass.

Under ideal conditions, the lens 200 focuses the light directly to the solar cell 102. However, in most circumstances, this does not occur due to a variety of causes, including but not limited to chromatic aberration of a refractive lens design, misalignment of the solar cell 102 relative to the lens 200 during construction, misalignment during operation due to tracker error, structural flexing, and wind load. The difference between an ideal setup and a misaligned setup may be a minor variation in the positioning of the lens of less than 1°.

The secondary optical element 104 is positioned along an optical path between the lens 200 and the solar cell 102 and acts as a light spill catcher to cause more of the light to reach the solar cell 102 in circumstances when the lens 200 does not focus light directly on the solar cell 102. The secondary optical element 104 includes an entry aperture 105 that receives concentrated light from the lens 200 and an exit aperture 107 that transmits the concentrated light towards the solar cell 102. The secondary optical element 104 may include a tapered shape with the entry aperture 105 being larger than the exit aperture 107. As shown in this implementation, the secondary optical element 104 has four reflective walls. In other implementations, different shapes (e.g., three-sided to form a triangular cross-section) may be employed. The secondary optical element 104 can be made of metal, plastic, or glass or other materials.

An intermediate region 112 extends between the apertures 105, 107 and includes a reflective surface to direct the light towards the solar cell 102. The reflective surface can be formed from different materials and have different optical characteristics. For example, in some implementations, the reflective surface includes a silver coating or other material for high reflectivity. In some cases, the reflective coating is protected by a passivation coating such as $SiO_2$ to protect against oxidation, tarnish or corrosion. An example of an optical element with a reflective surface is disclosed in U.S. patent application Ser. No. 12/402,814 filed on Mar. 12, 2009, which is incorporated herein by reference in its entirety.

The secondary optical element 104 has one or more mounting tabs 114 for attaching to a bracket 116 via one or more fasteners 118. The bracket 116 is provided for mounting the secondary optical element 104 to a heat sink 120 via one or more fasteners 122. The bracket 116 is thermally conductive so that heat energy generated by the secondary optical element 104 during operation can be transferred to the heat sink 120 and dissipated.

In one embodiment, a concentrator 106 is disposed along the optical path between the exit aperture 107 of the secondary optical element 104 and the solar cell 102. The concentrator 106 is preferably glass and has an optical inlet 108 and an optical outlet 110. In one embodiment, the concentrator 106 is solid glass. The concentrator 106 amplifies the light exiting the secondary optical element 104 and directs the amplified light toward the solar cell 102. In some implementations, the concentrator 106 has a generally square cross section that tapers from the inlet 108 to the outlet 110. In some implementations, the optical inlet 108 of the concentrator 106 is square-shaped and is about 2 cm×2 cm and the optical outlet 110 is about 0.9 cm×0.9 cm. The dimensions of the concentrator 106 may vary with the design of the solar cell module and the solar cell receiver 100. For example, in some implementations the dimensions of the optical outlet 110 are approximately the same as the dimensions of the solar cell 102. In one embodiment, the concentrator 106 is a 2× concentrator. The bottom surface of the concentrator 106 can be directly attached to the upper surface of the solar cell 102 using an adhesive such as a silicone adhesive.

The solar energy received by the solar cell 102 is concentrated by the lens 200 and the concentrator 106. In one embodiment, the light is concentrated by a factor of 1000 or more.

Figure 2:
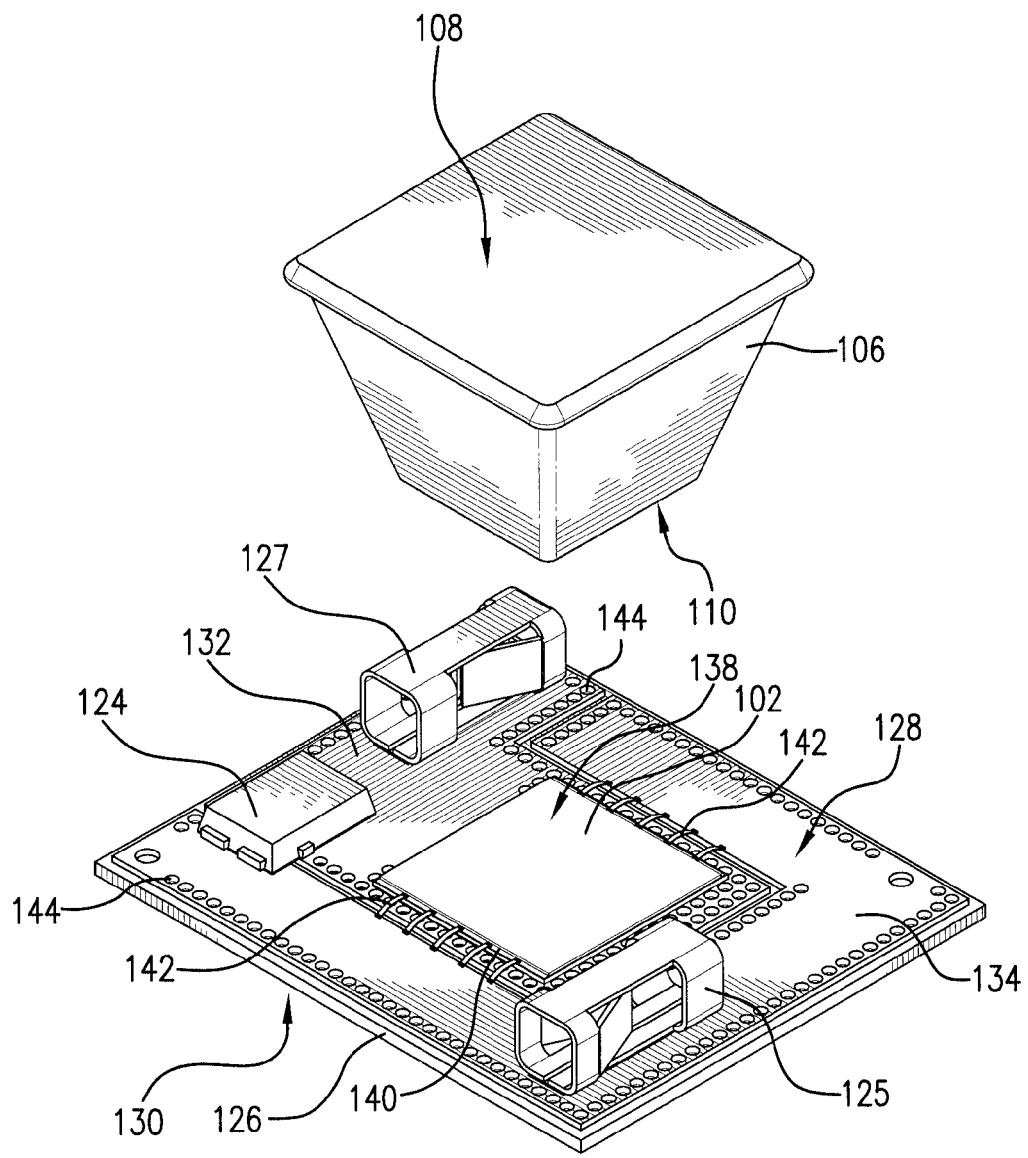
FIG. 2 is a partially exploded perspective view of an embodiment of a solar cell receiver including a concentrator, a solar cell, and a ceramic substrate.
Figure 3:
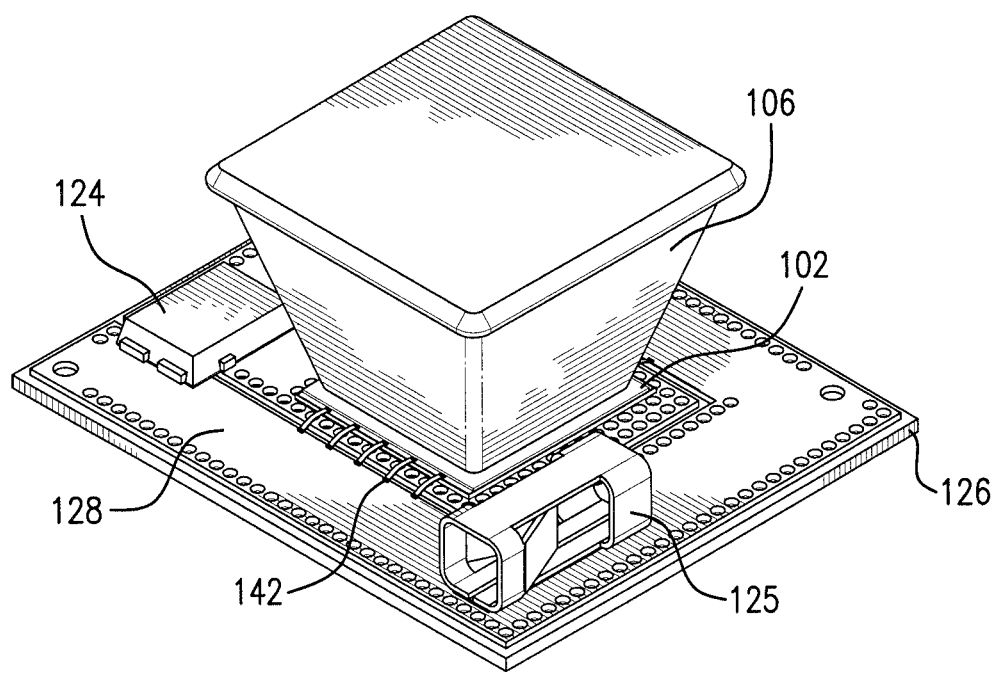
FIG. 3 is perspective view of an embodiment of a solar cell receiver with a concentrator, a solar cell, and a ceramic substrate.

FIG. 2 illustrates the solar cell 102 positioned along the optical path to receive the concentrated light and being mounted on a ceramic substrate 126. The ceramic substrate 126 has metalized upper and lower surfaces 128 and 130. Both surfaces 128 and 130 of the ceramic substrate 126 are metalized to increase the heat transfer capacity of the ceramic substrate 126, enabling the solar cell receiver 100 to more adequately handle rapid temperature changes that occur due to abrupt changes in solar cell operating conditions. For example, the solar cell 102 generates heat energy when converting light to electricity. Having both the upper and lower surfaces 128 and 130 of the ceramic substrate 126 metalized provides for a faster transfer of the heat energy from the solar cell 102 to the heat sink 120 for dissipation. The opposite condition occurs when the solar cell 102 becomes suddenly shaded. That is, the solar cell 102 stops producing electricity and rapidly cools as does the secondary optical element 104. The metalized upper and lower surfaces 128 and 130 of the ceramic substrate 126 prevent the solar cell 102 from cooling too rapidly by transferring heat energy from the heat sink 120 to the solar cell 102, and depending on the thermal conditions, to the secondary optical element 104 as well. The increased heat transfer capacity of the solar cell receiver 100 reduces the amount of stress imparted to the interface between the solar cell 102 and the ceramic substrate 126 during rapid temperature changes, ensuring a reliable solar cell-to-substrate interface.

The metalized upper surface 128 of the ceramic substrate 126 is in contact with the solar cell 102 and has separated conductive regions 132 and 134 for providing isolated electrically conductive paths to the solar cell 102. The first conductive region 132 provides an anode electrical contact point for the solar cell 102 and the second conductive region 134 provides a cathode electrical contact point for the solar cell 102.

In one embodiment, an upper conductive contact area 140 is disposed at the upper surface 138 of the solar cell 102 and occupies the perimeter of the solar cell 102. In some implementations, the upper conductive contact area 140 can be smaller or larger to accommodate the desired connection type. For example, the upper conductive contact area 140 may touch only one, two or three sides (or portions thereof) of the solar cell 102. In some implementations, the upper conductive contact area 140 is made as small as possible to maximize the area that converts solar energy into electricity, while still allowing electrical connection. While the particular dimensions of the solar cell 102 will vary depending on the application, standard dimensions are about a 1 cm². For example, a standard set of dimensions can be about 12.58 mm×12.58 mm overall, about 0.160 mm thick, and a total active area of about 108 mm². For example, in a solar cell 102 that is approximately 12.58 mm×12.58 mm, the upper conductive contact area 140 can be about 0.98 mm wide and the active area can be about 10 mm×10 mm.

The upper conductive contact area 140 of the solar cell 102 may be formed of a variety of conductive materials, e.g., copper, silver, and/or gold-coated silver. In this implementation, it is the n-conductivity cathode (i.e. emitter) side of the solar cell 102 that receives light, and accordingly, the upper conductive contact area 140 is disposed on the cathode side of the solar cell 102. In one embodiment, the upper conductive contact area 140 of the solar cell 102 is wire bonded to the second conductive region 134 of the metalized upper surface 128 of the ceramic substrate 126 via one or more bonding wires 142.

A bypass diode 124 is connected in parallel with the solar cell 102. In some implementations, the diode 124 is a semiconductor device such as a Schottky bypass diode or an epitaxially grown p-n junction. For purposes of illustration, the bypass diode 124 is a Schottky bypass diode. External connection terminals 125 and 127 are provided for connecting the solar cell 102 and the diode 124 to other devices, e.g., adjacent solar cell receivers (not shown).

The functionality of the bypass diode 124 can be appreciated by considering multiple solar cells 102 connected in series. Each solar cell 102 can be envisioned as a battery, with the cathode of each of the diodes 124 being connected to the positive terminal of the associated "battery" and the anode of each of the diodes 124 being connected to the negative terminal of the associated "battery." When one of the serially-connected solar cell receivers 100 becomes damaged or shadowed, its voltage output is reduced or eliminated (e.g., to below a threshold voltage associated with the diode 124). Therefore, the associated diode 124 becomes forward-biased, and a bypass current flows only through that diode 124 (and not the solar cell 102). In this manner, the non-damaged or non-shadowed solar cell receivers 100 continue to generate electricity from the solar energy received by those solar cells. If not for the bypass diode 124, substantially all of the electricity produced by the other solar cell receivers would pass through the shadowed or damaged solar cell receiver, destroying it, and creating an open circuit within, e.g., the panel or array. The solar cell receiver 100 also includes the ceramic substrate 126 such as an alumina substrate for mounting of the solar cell 102 and the heat sink 120 for dissipating heat generated by the solar cell 102 during operation.

The bypass diode 124 couples the first conductive region 132 of the metalized upper surface 128 to the second conductive region 134. In one embodiment, a cathode terminal of the bypass diode 124 is connected to the anode terminal of the solar cell 102 via the first conductive region 132 and an anode terminal of the bypass diode 124 is electrically connected to the cathode terminal of the solar cell 102 via the second conductive region 134. The anode terminal of the solar cell 102 is formed by a lower conductive surface. The cathode terminal of the solar cell 102 is formed by the upper conductive contact area 140 of the solar cell 102 as described above. The external connection terminals 125 and 127 disposed on the metalized upper surface 128 of the ceramic substrate 126 provide for electrical coupling of a device to the solar cell 102 and the bypass diode 124. In some implementations, the connector terminals 125 and 127 correspond to anode and cathode terminals, and are designed to accept receptacle plugs (not shown) for connection to adjacent solar cell receivers.

The upper surface 128 of the ceramic substrate 126 can be metalized by attaching the metallization layers 132 and 134 to the substrate. In one embodiment, holes 144 are formed in the metallization layers 132, 134. FIG. 2 shows the ceramic substrate 126 having two metallization layers 132 and 134 attached to the upper substrate surface 128. The metallization layers 132 and 134 are attached to the upper surface 128 of the ceramic substrate 126 by high temperature reactive bonding or other type of bonding process. A lower surface of the ceramic substrate 126 can be similarly metalized and attached to the heat sink 120.

Figure 4:
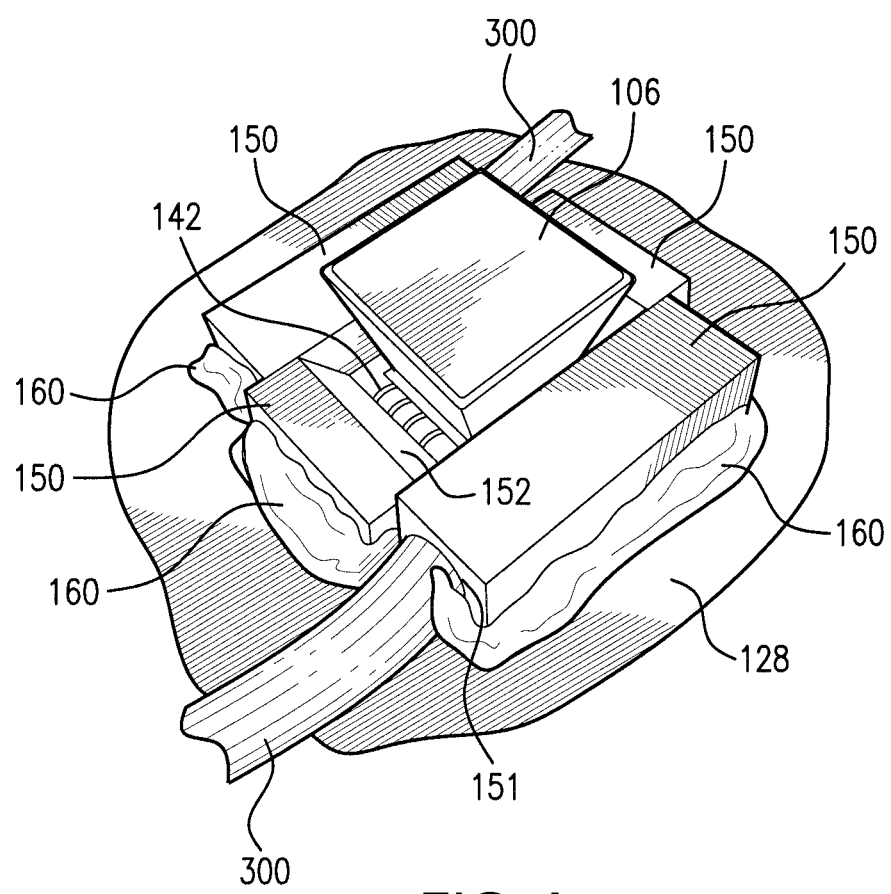
FIG. 4 is a perspective view of an embodiment of a solar cell receiver with a heat shield.

In some instances, the lens 200 is misaligned relative to the solar cell receiver 100 and concentrated light from the lens 200 strikes the substrate 126 and the various components mounted on the substrate 126. This concentrated light may burn the substrate 126 and components. To address this issue, a heat shield 150 is positioned to block the concentrated light from striking the substrate 126 and/or components as illustrated in FIG. 4. The heat shield 150 is constructed of materials to block the deleterious aspects of the concentrated light from reaching the various components. In one embodiment, the heat shield 150 is constructed of ceramic. Heat shields 150 may also be constructed from various other materials, including but not limited to metals, high-temperature plastics, and silvered glass.

In one embodiment, the heat shield 150 includes a fixed shape prior to the attachment to the solar cell receiver 100. As illustrated in FIG. 4, the heat shield 150 may include a first side that faces towards the substrate 126 and a second side that faces away from the substrate 126. The heat shield 150 may be constructed from a single piece, or may include multiple different pieces. FIG. 4 includes the heat shield 150 formed from four separate sections that are each attached to the solar cell receiver 100. Another embodiment includes the heat shield 150 formed as a single unit and sized and shaped to extend around the entire periphery of the solar cell 102. In heat shields 150 with different sections, the sections may be made from the same or different materials, and may have the same or different shapes or sizes.

The heat shield 150 may extend around an entire periphery of the solar cell 102 as illustrated in FIG. 4, or a limited section of the periphery. In one embodiment, the heat shield 150 is positioned along just a single side of the solar cell 102. In another embodiment, the heat shield 150 is positioned over just the components on the substrate 126. In one embodiment, the heat shield 150 is positioned just over the diode 124.

The heat shield 150 may be attached in various manners. In one embodiment, an adhesive 160 is used to attach the heat shield 150. In one specific embodiment, the adhesive 160 is a silicon-based adhesive. Other adhesives 160 may also be used to attach the heat shield 150, including epoxies and urethanes. The heat shield 150 may also be attached with mechanical fasteners, such as pins, rivets, and screws. In heat shields 150 constructed from multiple sections, the sections may be attached by different methods.

The heat shield 150 may be shaped to conform to the various components. The heat shield 150 may include a cut-out 152 on an underside to accommodate leads 300 that extend from the terminals 125, 127. Similar cut-outs may also be included to accommodate other components, such as the diode 124. The heat shield 150 may include a sloping side 151 as illustrated in FIG. 4 that roughly corresponds to the tapering shape of the concentrator 106.

The heat shield 150 may be laterally spaced away from the periphery of the solar cell 102. This ensures that the heat shield 150 does not block the concentrated light from reaching the solar cell 102. In one embodiment as illustrated in FIG. 4, the heat shield 150 is positioned laterally away from the solar cell 102 and adjacent to the wires 142 that connect with the solar cell 102. In the embodiment of FIG. 4, the wires 142 are exposed because the misaligned concentrated light is prevented from striking the wires 142 by the tapering shape of the concentrator 106.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Without further analysis, from the foregoing others can, by applying current knowledge, readily adapt the present invention for various applications. Such adaptations should and are intended to be comprehended within the meaning and range of equivalence of the following claims.

What is claimed is:

1. A solar cell receiver subassembly for use in a concentrating solar system that concentrates solar energy onto a solar cell for converting the solar energy to electricity, comprising:
    an optical device positioned along an optical path and including an enlarged entry aperture and a reduced exit aperture, wherein the enlarged entry aperture is larger than the reduced exit aperture;
    a concentrator positioned at the exit aperture along the optical path, the concentrator including at least one sloping side;
    a support positioned along the optical path and on an opposite side of the concentrator from the optical device, wherein the support defines an upper surface facing an upper direction and a lower metallized surface facing a lower direction, wherein the lower direction is opposite the upper direction;
    a solar cell mounted on the upper surface of the support and along the optical path, the solar cell comprising one or more III-V compound semiconductor layers, wherein the solar cell defines an upper surface facing the upper direction and the concentrator, a lower surface opposite the upper surface and facing the lower direction and the upper surface of the support, and at least one side surface extending between the lower surface and the upper surface, wherein the at least one side surface defines a periphery extending around the solar cell; and
    a ceramic heat shield mounted over the support, wherein all of the heat shield is located outside the periphery of the solar cell defined by the at least one side surface to protect the support from concentrated light,
    wherein the ceramic heat shield includes a tapered side that tapers away from the solar cell to expose the solar cell to the optical path and slopes in the same direction as the sloping side of the concentrator, wherein the tapered side of the heat shield and the sloping side of the concentrator are adjacent sides.

2. The solar cell receiver subassembly of claim 1, wherein the optical device includes a tapered shape that reduces in size from the entry aperture to the exit aperture, the optical device including reflective sidewalls that extend between the entry aperture and exit aperture.

3. The solar cell receiver subassembly of claim 1, wherein the heat shield is a fixed shape, wherein the heat shield defines a first side that faces the lower direction and is mounted to the upper surface of the support and a second side opposite the first side that faces away from the support and in the upper direction.

4. The solar cell receiver subassembly of claim 1, wherein the heat shield extends completely around the periphery of the solar cell.

5. The solar cell receiver subassembly of claim 1, further comprising a bypass diode attached to the upper surface of the support with the heat shield extending over the bypass diode.

6. The solar cell receiver subassembly of claim 1, wherein the heat shield is spaced away from the at least one side surface of the solar cell.

7. The solar cell receiver subassembly of claim 1, wherein the heat shield is mounted to the support with an adhesive.

8. A solar cell receiver subassembly for use in a concentrating solar system that concentrates the solar energy onto a solar cell for converting solar energy to electricity, comprising:
    an optical device with a tapered shape including a large entry aperture, a small exit aperture, and reflective sidewalls that extend between the large entry and small exit apertures, wherein the large entry aperture is larger than the small exit aperture and the optical device is positioned along an optical path;

a support defining an upper surface facing an upper direction and a lower surface facing a lower direction, wherein the lower direction is opposite the upper direction, wherein the support is positioned along the optical path;

a concentrator disposed in the optical path between the upper surface of the support and the optical device, the concentrator including at least one sloping side;

a solar cell mounted on the upper surface of the support and along the optical path, the solar cell comprising one or more III-V compound semiconductor layers, wherein the solar cell defines an upper surface facing the upper direction and the concentrator, a lower surface opposite the upper surface and facing the lower direction and the upper surface of the support, and at least one side surface extending between the lower surface and the upper surface, wherein the at least one side surface defines a periphery extending around the solar cell; and a ceramic heat shield mounted over the support, wherein all of the heat shield is located outside the periphery of the solar cell defined by the at least one side surface and spaced away from the solar cell to protect the support from concentrated light, wherein the ceramic heat shield includes a tapered side that tapers away from the solar cell to expose the solar cell to the optical path and slopes in the same direction as the sloping side of the concentrator, wherein the tapered side of the heat shield and the sloping side of the concentrator are adjacent sides.

9. The solar cell receiver subassembly of claim 8, wherein the heat shield has a fixed shape prior to attachment to the support, wherein the heat shield defines a first side that is mounted to the upper surface of the support and faces the lower direction and a second side opposite the first side that faces away from the support and in the upper direction.

10. The solar cell receiver subassembly of claim 9, wherein the heat shield includes a plurality of individual sections that are each separately mounted to the support.

11. The solar cell receiver subassembly of claim 8, further comprising a diode mounted on the support and having a body, an anode terminal and cathode terminal, the diode being covered by the heat shield.

12. The solar cell receiver subassembly of claim 8, wherein the heat shield extends around an entirety of the periphery of the solar cell.

13. The solar cell receiver subassembly of claim 8, wherein the support is a ceramic substrate, wherein the upper surface and the lower surface are each metalized surfaces.

* * * * *